(12) United States Patent
Lee

(10) Patent No.: US 8,339,180 B2
(45) Date of Patent: Dec. 25, 2012

(54) RF SWITCHING DEVICE AND METHOD THEREFOR

(75) Inventor: Jong Soo Lee, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 79 days.

(21) Appl. No.: 12/934,999

(22) PCT Filed: Feb. 4, 2009

(86) PCT No.: PCT/KR2009/000536
§ 371 (c)(1),
(2), (4) Date: Dec. 14, 2010

(87) PCT Pub. No.: WO2009/119974
PCT Pub. Date: Oct. 1, 2009

(65) Prior Publication Data
US 2011/0210784 A1  Sep. 1, 2011

(30) Foreign Application Priority Data
Mar. 27, 2008  (KR) .................. 10-2008-0028383

(51) Int. Cl.
  *H03K 17/687* (2006.01)
(52) U.S. Cl. ............ 327/427; 327/434; 327/435
(58) Field of Classification Search ........... 327/365–508
  See application file for complete search history.

(56) References Cited

U.S. PATENT DOCUMENTS

| | | | | |
|---|---|---|---|---|
| 7,650,133 | B2 * | 1/2010 | Miura et al. ................. | 455/341 |
| 2002/0123186 | A1 | 9/2002 | Mayama et al. | |
| 2003/0090313 | A1 * | 5/2003 | Burgener et al. ............ | 327/408 |
| 2004/0207454 | A1 * | 10/2004 | Hidaka et al. ................. | 327/427 |
| 2004/0246044 | A1 * | 12/2004 | Myono et al. ................. | 327/536 |
| 2007/0013432 | A1 * | 1/2007 | Miyazawa .................... | 327/404 |
| 2007/0049352 | A1 * | 3/2007 | Nakajima et al. ............ | 455/571 |
| 2007/0115044 | A1 * | 5/2007 | Chan et al. .................... | 327/540 |
| 2007/0120103 | A1 | 5/2007 | Burgener et al. | |
| 2008/0197923 | A1 * | 8/2008 | Nakajima et al. ......... | 330/124 R |
| 2010/0117713 | A1 * | 5/2010 | Katoh et al. .................. | 327/427 |
| 2011/0260774 | A1 * | 10/2011 | Granger-Jones et al. ..... | 327/427 |

FOREIGN PATENT DOCUMENTS

KR         100177145 B1    11/1998
KR      1020060038442 A     5/2006

OTHER PUBLICATIONS

Keiichi Numata et al., "A High-Power-Handling GSM Switch IC with New Adaptive-Control-Voltage-Generator Circuit Scheme", IEEE Radio Frequency Integrated Circuits Symposium, 2003, pp. 233-236, IEEE.
International Search Report for PCT/KR2009/000536 filed on Feb. 4, 2009.
Written Opinion of the International Searching Authority for PCT/KR2009/000536 filed on Feb. 4, 2009.

* cited by examiner

*Primary Examiner* — Lincoln Donovan
*Assistant Examiner* — Brandon S Cole

(57) ABSTRACT

Disclosed are an apparatus and a method for switching RF signals. An RF switching apparatus according to an exemplary embodiment of the present invention includes: a plurality of FETs passing or blocking high-frequency signals depending on driving voltage applied to a gate; a control power supply generating control voltage for controlling the passing or blocking of the high-frequency signals; and a charge pump increasing the level of the control voltage and outputting the corresponding voltage as the driving voltage. According to the exemplary embodiment of the present invention, it is possible to minimize insertion loss generated in an RF switch.

5 Claims, 3 Drawing Sheets

[Figure 1]
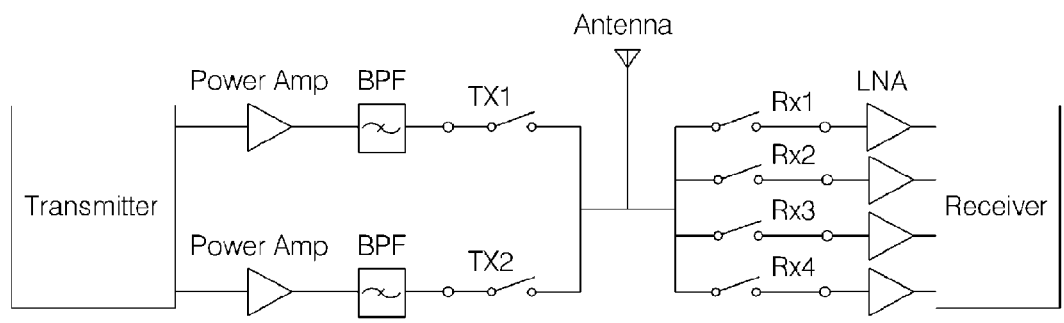
[Figure 2]
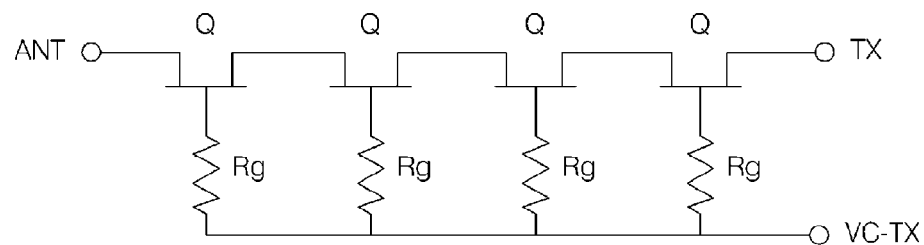
[Figure 3]
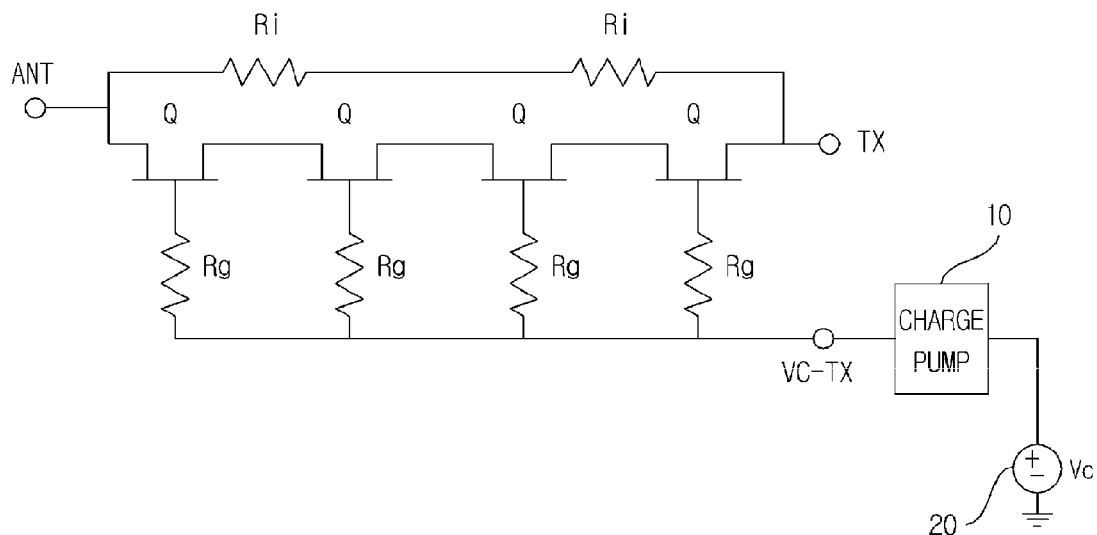

[Figure 4]
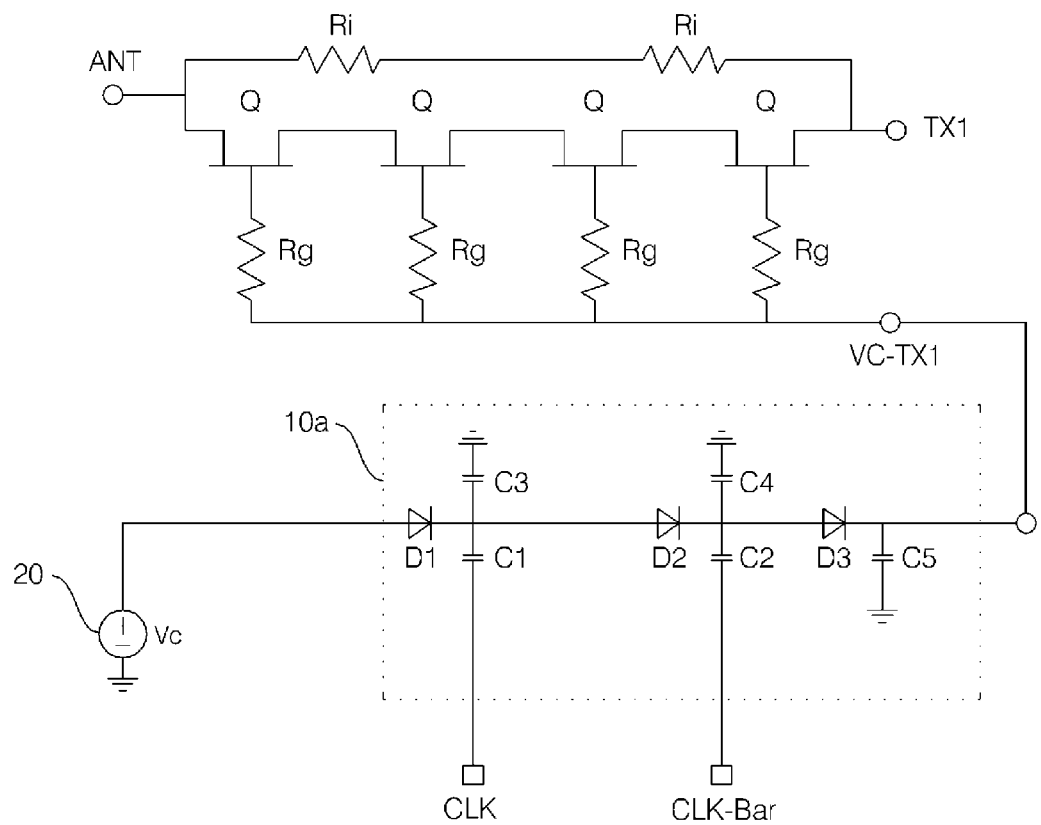

[Figure 5]
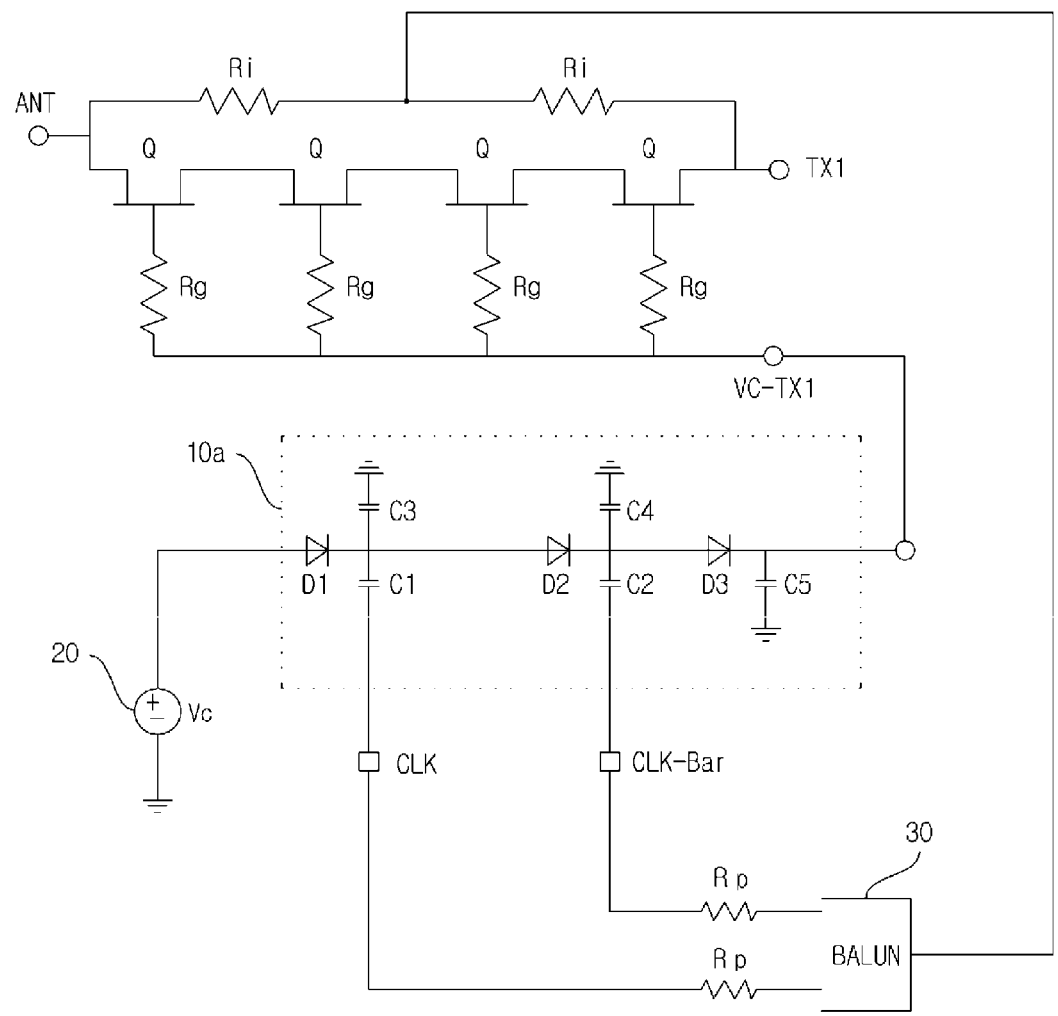

RF SWITCHING DEVICE AND METHOD THEREFOR

TECHNICAL FIELD

The present invention relates to an RF switching device and method therefor, and more particularly, to an apparatus and a method for switching RF signals that pass or block high-frequency signals depending on driving voltage applied to a plurality of FETs.

BACKGROUND ART

In recent years, in a wireless communication system such as a cellular phone, a wireless LAN, or the like, a demand for terminals usable in multi-modes or multi-bands has increased. For example, the terminals include a cellular phone having a wireless LAN function, a cellular phone usable in multi-bands, a wireless LAN device usable in multi-bands, and the like. In general, the terminals that provide the multi-modes or multi-bands essentially include an RF switching apparatus that is connected to an antenna and functions to select any one of the multiple modes or multiple bands.

FIG. 1 illustrates a schematic configuration diagram of a representative multi-band terminal. Referring to FIG. 1, a transmitter outputs signals transmission signals corresponding to two frequency bands and each transmission signal is amplified by a power amplifier and then passes through a band-pass filter (BPF) and thereafter, is transmitted through an antenna. Meanwhile, a reception signal that is received through the antenna is amplified by a low noise amplifier and transferred to a receiver. The receiver is implemented to demodulate reception signals corresponding to four frequency bands, respectively. Like this, six RF switches are connected to the antenna in order to the transmission signal or reception signal corresponding to each frequency band as shown in the figure. In addition, it is possible to transmit a transmission signal of a desired frequency band or receive a reception signal of a desired frequency band by controlling each switch.

In the multi-band terminal, insertion loss is essentially generated due to the RF switch. In general, the insertion loss generated due to the RF switch is not a big problem in the receiver. However, in the transmitter that needs to send a very high output signal, if the insertion loss increases, the output of the power amplifier needs to increase in order to maintain output power constantly. As such, if the output of the power amplifier increases, unnecessary harmonic components increase and linearity deteriorates, in particular, the power consumption of the power amplifier increases as much. Therefore, the life-span of a battery of the terminal is shortened.

DISCLOSURE

Technical Problem

The present invention has been made in an effort to provide an apparatus and a method for switching RF signals and a multi-band terminal having the same that can minimize insertion loss generated in an RF switch.

Technical Solution

An exemplary embodiment of the present invention provides an RF switching apparatus that includes: a plurality of FETs passing or blocking high-frequency signals depending on driving voltage applied to a gate; a control power supply generating control voltage for controlling the passing or blocking of the high-frequency signals; and a charge pump increasing the level of the control voltage and outputting the corresponding voltage as the driving voltage.

In this case, the charge pump may be a Dickson charge pump and the high-frequency signals may be detected and used as clock signals inputted into the Dickson charge pump.

Further, the RF switching apparatus may further include a balun receiving the detected high-frequency signals and outputting the received signals as two signals having a retardation of 180° and two signals may be inputted into the Dickson charge pump as the clock signals.

The RF switching apparatus may further include a plurality of resistors provided in series between an input terminal and an output terminal of the RF switching apparatus and the high-frequency signals to be inputted into the balun may be detected among the plurality of resistors.

Another exemplary embodiment of the present invention provides a multi-band terminal that includes an RF switching apparatus.

Yet another exemplary embodiment of the present invention provides an RF switching method for passing or blocking high-frequency signals depending on driving voltage applied to a plurality of FETs that includes: (a) generating control voltage for controlling the passing or blocking of the high-frequency signals; (b) increasing the level of the control voltage by using a charge pump and outputting the corresponding voltage as the driving voltage; and (c) blocking or passing the high-frequency signals by applying the driving voltage to the plurality of FETs.

In this case, the charge pump may be a Dickson charge pump and the step (b) may include: (b1) detecting the high-frequency signals; (b2) converting the detected high-frequency signals into two signals having a retardation of 180° by using a balun; and (b3) receiving, by the Dickson charge pump, two signals as clock signals and increasing the level of the control voltage to output the corresponding voltage as the driving voltage.

Further, at step (b1), the high-frequency signals may be detected among a plurality of resistors provided in series between an input terminal and an output terminal.

Advantageous Effects

According to the exemplary embodiment of the present invention, it is possible to minimize insertion loss generated in an RF switch. Accordingly, since the output of a power amplifier of a multi-band terminal can be reduced, unnecessary harmonic components decrease, linearity is improved, and the life-span of a battery of the terminal is lengthened.

DESCRIPTION OF DRAWINGS

FIG. 1 illustrates a schematic configuration diagram of a representative multi-band terminal.

FIG. 2 is a schematic circuit diagram of a general RF switch.

FIG. 3 is a schematic circuit diagram of an RF switching apparatus according to an exemplary embodiment of the present invention.

FIG. 4 is a circuit diagram illustrating a more detailed exemplary embodiment of the RF switching apparatus shown in FIG. 3.

FIG. 5 is a circuit diagram illustrating a more detailed another exemplary embodiment of the RF switching apparatus shown in FIG. 3.

BEST MODE

Hereinafter, exemplary embodiments of the present invention will be described in detail with reference to the accompanying drawings. In the following description and drawings, like components refer to like reference numerals and therefore, the duplicated description thereof will be omitted. In addition, the detailed description of known functions and configurations will be omitted so as not to obscure the subject of the present invention with unnecessary detail.

First, referring to FIG. 2 illustrating a schematic circuit diagram of a general RF switch, insertion loss generated in the RF switch will be analyzed. The general RF switch includes a plurality of field effect transistors (hereinafter referred to as "FETs") Q each of which a source and a drain are connected between an input terminal and an output terminal of the RF switch and a resistor Rg connected to a gate of each FET Q as shown in FIG. 2. The reason to use the plurality of FETs Q is that the switch constituted by the FETs Q receive high electric power. Driving voltage VC_TX for controlling the passing or blocking of a high-frequency signal between the source and the drain is applied to the gate of each FET Q and the high-frequency signal passes through the source and drain of each FET depending on the driving voltage.

In this case, when the number of FETs Q is n, DC voltage of a terminal TX into which the high-frequency signal is inputted is $V_{RF}$, threshold voltage of the FET Q is $V_t$, and impedance of a circuit is $Z_0$ (generally, 50Ω), the maximum electric power which can be received by the RF switch is shown in the following equation.

$$P_{Max} = \frac{2 \cdot [n(V_{RF} + V_t)]^2}{Z_0} \quad \text{[Equation 1]}$$

In addition, insertion loss (IL) (dB) in the RF switch is shown in the following equation.

$$IL = 20 \cdot \log\left(\frac{2R_0}{2R_0 + R_{ON}}\right) \quad \text{[Equation 2]}$$

In the above equation, $R_0$ is the impedance (generally 50Ω) of the circuit and $R_{ON}$ is resistance between the drain and the source of the FET Q when FET Q is in an ON state.

Herein, the ON resistance $R_{ON}$ of the FET is shown in the following equation.

$$R_{ON} \propto \frac{n}{W_G(V_{C(ON)} - V_{RF} - V_t)} \quad \text{[Equation 3]}$$

In the above equation, n represents the number of FETs Q, $W_G$ represents a gate width of the FET Q, $V_{C(ON)}$ represents voltage applied to the gate for the ON state of the FET Q, $V_{RF}$ represents the DC voltage of the terminal TX into which the high-frequency signal is inputted and $V_t$ represents the threshold voltage of the FET Q.

Referring to the equations, the resistance $R_{ON}$ should be reduced in order to reduce the insertion loss. For this, the gate width $W_G$ of the FET Q is increased, the number of FETs Q is decreased, or $V_{C(ON)}$ is increased. Herein, when the number of FETs Q is decreased, the electric power which is received by the switch is decreased, when the gate width of the FET Q is increased, an isolation ability is deteriorated due to an increase of capacitance of the FET Q in an OFF state. Therefore, the most effective method to reduce the insertion loss is to increase $V_{C(ON)}$, that is, the voltage applied to the gate for the ON state of the FET Q. Accordingly, in the exemplary embodiment of the present invention, the insertion loss may be reduced by increasing the voltage applied to the gate for the ON state of the FET Q.

FIG. 3 is a schematic circuit diagram of an RF switching apparatus according to an exemplary embodiment of the present invention. Referring to FIG. 3, the RF switching apparatus according to the exemplary embodiment includes a plurality of FETs Q each of which a source and a drain are connected to each other between an input terminal TX and an output terminal ANT, resistors Rg each of which one end is connected to a gate of each FET Q and the other end is connected to an output of a charge pump 10, resistors Ri provided in series between the input terminal TX and the output terminal ANT, a control power supply 20 generating control voltage Vc, and the charge pump 10 increasing and outputting the level of the control voltage Vc. The resistor Rg serves to reduce leakage current that flows into the gate and the resistor Ri serves to assist isolation of another RF switch (not shown) connected to the RF switching terminal shown in the figure.

Each FET Q is in an ON or OFF state depending on driving voltage applied to the gate. That is, when the driving voltage applied to the gate is at a high level, each FET Q is in the ON state and when the driving voltage is at a low level, each FET Q is in the OFF state. A high-frequency signal outputted from a transmitter (not shown) is inputted into the input terminal TX. The high-frequency signal is outputted to the output terminal ANT by passing through the plurality of FETs Q while the FETs Q are in the ON state and the high-frequency signal is blocked while the FETs Q are in the OFF state.

The control power supply 20 generates the control voltage Vc for controlling the passing or blocking of the high-frequency signal and the control voltage Vc is inputted into the charge pump 10. The charge pump 10 increases the level of the inputted control voltage Vc and outputs the corresponding voltage as the driving voltage to be applied to the gate of each FET Q. As such, the driving voltage applied to the gate of each FET Q is increased by the charge pump 10 to reduce the insertion loss as shown in Equations 2 and 3.

FIG. 4 is a circuit diagram illustrating a more detailed exemplary embodiment of the RF switching apparatus shown in FIG. 3 and illustrates the exemplary embodiment in which a Dickson charge pump 10a is used as one example of the charge pump 10.

As shown in the figure, in the Dickson charge pump 10a, an input terminal is connected to the control power supply 20 and an output terminal is connected to one end of each of the resistor Rg and two clock signals having a retardation of 180° used to increase and output the level of the input voltage are inputted through terminals CLK and CLK_BAR.

The Dickson charge pump 10a includes a plurality of diodes D1, D2, and D3 provided in series between the input terminal and the output terminal, capacitors C3, C4, and C5 each of which one end is connected to a cathode of each of the diodes and the other end is grounded, and capacitors C1 and C2 of which ends are cathodes of the diodes D1 and D2 and the other ends are connected to the terminals CLK and CLK_BAR, respectively. Although three diodes D1, D2, and D3 are connected to the Dickson charge pump 10a in the exemplary embodiment, three or more (for example, five, seven, and the like) diodes may be connected to the pump 10a. In this case, two clock signals having the retardation of 180° are alternately inputted into the cathodes of the diodes. Herein, two clock signals may be square wave signals having the retardation of 180°.

FIG. 5 is a circuit diagram illustrating a more detailed another exemplary embodiment of the RF switching apparatus shown in FIG. 3. According to the exemplary embodiment, the high-frequency signals of the RF switching apparatus are detected and used as the clock signals inputted into the Dickson charge pump 10a. In general, the Dickson charge pump uses the square wave signals having the retardation of 180° as the clock signals and an apparatus for generating the square wave signal should be additionally provided in order to use the square wave signals. However, if the clock signals inputted into the Dickson charge pump maintain the retardation of 180° from each other, the clock signals need not to be the square wave signals. Therefore, in the exemplary embodiment, the high-frequency signals of the RF switching apparatus are detected and used as the clock signals instead of the square wave signals.

Referring to FIG. 5, the high-frequency signals to be used as the clock signals are detected among the resistors Ri provided in series between the input terminal TX and the output terminal ANT. The detected high-frequency signals are inputted into a balun 30 which is an element converting an unbalanced signal and a balanced signal into each other. The balun 30 converts and outputs the detected high-frequency signals which are the unbalanced signal as two signals having the retardation of 180° which is the balanced signal. Two outputted signals having the retardation of 180° are inputted into the terminals CLK and CLK_BAR through resistor Rp for signal attenuation, respectively. The Dickson charge pump 10a increase the level of the control voltage Vc by using two inputted signals and outputs the corresponding voltage as voltage for driving the FET Q. In the exemplary embodiment, the high-frequency signals to be used as the clock signals of the Dickson charge pump 10a are detected between the resistors Ri, but the high-frequency signals may be detected even in other parts of the RF switching apparatus. For example, the high-frequency signals may be detected on an output terminal TX1, an input terminal ANT, or a source terminal or a drain terminal of any one of the FETs Q.

According to the exemplary embodiment of the present invention, since the charge pump increases the control voltage for controlling the passing or blocking of the high-frequency signal and outputs the corresponding voltage as the driving voltage of the FET, the insertion loss of the RF switching apparatus can be minimized. Further, when the high-frequency signal is detected and used as the clock signal at the time of using the charge pump as the Dickson charge pump, the apparatus for generating the square wave signal needs not to be additionally provided, thereby simplifying the configuration of the circuit.

The RF switching apparatus according to the exemplary embodiments may be adopted in, for example, the multi-band terminal shown in FIG. 1. In this case, the RF switching apparatus according to the exemplary embodiment may be provided in the transmitters TX1 and TX2 of the multi-band terminal and the known RF switch may be provided in the receivers RX1, RX2, RX3, and RX4. As such, when the RF switching apparatus according to the exemplary embodiments is adopted in the multi-band terminal, the insertion loss in the RF switch is minimized, as a result, the output of the power amplifier can be reduced. Accordingly, unnecessary harmonic components are decreased and linearity is improved, in particular, the power consumption of the power amplifier is decreased as much. Therefore, the life-span of the battery of the terminal is lengthened.

Hitherto, the present invention has been described based on the exemplary embodiments. It will be appreciated by those skilled in the art that various modifications, changes, and substitutions can be made without departing from the essential characteristics of the present invention. Accordingly, the embodiments disclosed in the present invention and the accompanying drawings are used not to limit but to describe the spirit of the present invention. The protection scope of the present invention must be analyzed by the appended claims and it should be analyzed that all spirits within a scope equivalent thereto are included in the appended claims of the present invention.

The invention claimed is:

1. An RF switching apparatus, comprising:
   a plurality of FETs passing or blocking high-frequency signals depending on a driving voltage applied to a gate;
   a control power supply generating control voltage for controlling the passing or blocking of the high-frequency signals;
   a Dickson charge pump increasing the level of the control voltage and outputting the corresponding voltage as the driving voltage; and
   a balun receiving the detected high-frequency signals and outputting the received signals as two signals having a retardation of 180°, wherein two signals are inputted into the Dickson charge pump as the clock signals,
   wherein the high-frequency signals are detected and used as clock signals inputted into the Dickson charge pump.

2. The apparatus of claim 1, further comprising: a plurality of resistors provided in series between an input terminal and an output terminal of the RF switching apparatus, wherein the high-frequency signals to be inputted into the balun are detected among the plurality of resistors.

3. A multi-band terminal, comprising an RF switching apparatus of claim 1.

4. An RF switching method passing or blocking high-frequency signals depending on driving voltage applied to a plurality of FETs, comprising:
   (a) generating control voltage for controlling the passing or blocking of the high-frequency signals;
   (b) increasing the level of the control voltage by using a Dickson charge pump and outputting the corresponding voltage as the driving voltage; and
   (c) blocking or passing the high-frequency signals by applying the driving voltage to the plurality of FETs,
   wherein step (b) includes:
   (b1) detecting the high-frequency signals;
   (b2) converting the detected high-frequency signals into two signals having a retardation of 180° by using a balun; and
   (b3) receiving, by the Dickson charge pump, two signals as clock signals and increasing the level of the control voltage to output the corresponding voltage as the driving voltage.

5. The method of claim 4, wherein at step (b1), the high-frequency signals are detected among a plurality of resistors provided in series between an input terminal and an output terminal.

* * * * *